(12) United States Patent
Machida

(10) Patent No.: US 8,330,277 B2
(45) Date of Patent: Dec. 11, 2012

(54) SEMICONDUCTOR ELEMENT BUILT-IN DEVICE

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 207 days.

(21) Appl. No.: 12/971,596

(22) Filed: Dec. 17, 2010

(65) Prior Publication Data

US 2011/0156264 A1 Jun. 30, 2011

(30) Foreign Application Priority Data

Dec. 24, 2009 (JP) ................. 2009-291632

(51) Int. Cl.
*H01L 23/48* (2006.01)
(52) U.S. Cl. ............... 257/773; 257/778; 257/E21.502; 257/E21.503; 257/E21.511
(58) Field of Classification Search .................. 438/108, 438/126; 257/686, 697, 778, E21.502, E21.503, 257/E21.511, 773
See application file for complete search history.

(56) References Cited

U.S. PATENT DOCUMENTS

| 7,452,797 | B2 | 11/2008 | Kukimoto et al. | |
|---|---|---|---|---|
| 7,772,687 | B2 | 8/2010 | Inoue | |
| 8,133,762 | B2 * | 3/2012 | Pagaila et al. | 438/117 |
| 2008/0135279 | A1 | 6/2008 | Ishido | |
| 2009/0008765 | A1 | 1/2009 | Yamano et al. | |
| 2009/0014859 | A1 * | 1/2009 | Jeung et al. | 257/686 |

FOREIGN PATENT DOCUMENTS

| JP | 2004-079872 | 3/2004 |
|---|---|---|
| JP | 2004-319676 | 11/2004 |
| JP | 2008-135781 | 6/2008 |

* cited by examiner

*Primary Examiner* — Brook Kebede
(74) *Attorney, Agent, or Firm* — Rankin, Hill & Clark LLP

(57) ABSTRACT

A semiconductor element built-in device includes: a first substrate having a first pad thereon; a semiconductor element on the first substrate; a second substrate having a second pad thereon and mounted on the first substrate via a solder terminal having a solder coated thereon; a resin layer provided between the first substrate and the second substrate such that the solder terminal and the semiconductor element are embedded in the resin layer; and a dam provided at least partially around at least one of the first and second pads, the dam being configured to restrain the solder flowing from the solder terminal.

8 Claims, 13 Drawing Sheets

SEMICONDUCTOR ELEMENT BUILT-IN DEVICE

This application claims priority from Japanese Patent Application No. 2009-291632, filed on Dec. 24, 2009, the entire contents of which are herein incorporated by reference.

BACKGROUND

1. Technical Field

The present disclosure relates to a semiconductor element built-in device.

2. Related Art

FIG. 13 shows a configuration of a semiconductor element built-in device 70. In the semiconductor element built-in device 70, a semiconductor element 10 is mounted on a first substrate 20 by a flip-chip connection, as shown in FIG. 10, then a second substrate 30 is bonded to an semiconductor element mounting surface of the first substrate 20, on which the semiconductor element 10 is mounted, via solder terminals 40 (see FIG. 11), then a stacked substrate 60 including the first substrate 20 and the second substrate 30 is formed by filling a space between the first substrate 20 and the second substrate 30 with a resin 50 (see FIG. 12), and then the external connection terminal 62 is provided to connection pads 24 of the stacked substrate 60 (see FIG. 13).

A protection film 23 made of a solder resist is coated on the element mounting surface of the first substrate 20 to expose electrodes 11, which are connected to the semiconductor element 10, and pads 22, to which the solder terminals 40 are provided (see FIG. 10). Each of the solder terminals 40 is made by coating an outer surface of a copper ball 40a with solder 40b. The solder terminal 40 is provided to both the pads 22 of the first substrate 20 and pads 32 of the second substrate 30 respectively such that a predetermined space is formed between the first substrate 20 and the second substrate 30 (see FIG. 11) (see e.g., JP-A-2008-135781 and its corresponding U.S. application publication No. 2009/008765, JP-A-2004-319676 and its corresponding U.S. Pat. No. 7,452,797, and U.S. Pat. No. 7,772,687).

In manufacturing the semiconductor element built-in device 70 shown in FIG. 13, the stacked substrate 60 is formed by filling a space formed between the first substrate 20 and the second substrate 30 with the resin 50, and then the external connection terminals (solder balls) 62 are provided to the stacked substrate 60 by the reflow heating. In this heating step, the solder is heated up to a temperature at which the solder can be fused, and thus the solder 40b elutes from the solder terminals 40 that are sealed with the resin 50 at this time. Therefore, such a problem arises that the solder 40b flows out onto the neighboring pads 22, 32, resulting in an electrical short-circuit between the pads. In FIG. 13, the flowing-out of the solder (S portion) is shown.

The electrical short-circuit is caused due to the flowing-out of the solder 40b because a good adhesion between the sealing resin 50 and the protection films 23, 33, which protect surfaces of the first substrate 20 and the second substrate 30 respectively, is not always ensured. More particularly, the solder resist is employed as the protection films 23, 33 respectively, and in this case the adhesion between this solder resist and the resin 50 is insufficient. Therefore, upon sealing the semiconductor element 10 and the solder terminals 40 with the resin 50, in some cases a clearance is formed between the resin 50 and the solder resist. As a result, the solder 40b flows into this clearance, and the pads are short-circuited electrically.

In order to improve the adhesion between the resin 50 and the protection films 23, 33, there is a method of roughening the surfaces of the protection films 23, 33 by applying the plasma process in advance to the protection films 23, 33. However, even though such method is applied, the clearance is generated at the boundary between the resin 50 and the protection films 23, 33, and thus the fused solder flows into this clearance. Therefore, the electrical short-circuit is caused.

Meanwhile, the adhesion between the resin 50 and the protection films 23, 33 is varied in characteristics. Therefore, it is difficult to control precisely the adhesion between the resin 50 and the protection films 23, 33 in the actual manufacturing steps. As a result, such a problem exists that the electrical short-circuit, which is caused in providing nection terminals 62 by the solder reflow, causes the defective product.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

Accordingly, it is an illustrative aspect of the present invention to provide a semiconductor element built-in device capable of improving a production yield by preventing such an event that an electrical short-circuit is caused due to flowing-out of the solder in manufacturing a semiconductor element built-in device.

According to one or more aspects of the invention, there is provided a semiconductor element built-in device. The semiconductor element built-in device, includes: a first substrate comprising a first surface and a second surface, which are formed on opposite sides of the first substrate; a first pad provided on the first surface of the first substrate; a first protection film formed on the first surface of the first substrate, through which the first pad is exposed; a semiconductor element provided on the first surface of the first substrate such that the semiconductor element is surrounded by the first pad; a second substrate comprising a first surface and a second surface, which are formed on opposite sides of the second substrate, the second substrate being mounted on the first substrate via a solder terminal; a second pad provided on the first surface of the second substrate to face the first pad provided on the first surface of the first substrate, wherein the solder terminal extends between the first pad and the second pad and comprises solder coated thereon; a second protection film formed on the first surface of the second substrate through which the second pad is exposed; a resin layer provided between the first substrate and the second substrate such that the solder terminal and the semiconductor element are embedded in the resin layer; and a dam provided at least partially around at least one of the first and second pads so as to project away from at least one of the first and second protection films, the dam being configured to restrain the solder flowing from the solder terminal.

According to one or more aspects of the invention, there is provided a semiconductor element built-in device. The device comprises: a first substrate comprising a first surface and a second surface, which are formed on opposite sides of the first substrate; a plurality of first pads provided on the first surface of the first substrate; a first protection film formed on the first surface of the first substrate, through which the first pads are exposed; a semiconductor element on the first surface of the first substrate; a second substrate comprising a first surface and a second surface, which are formed on opposite sides of the second substrate, the second substrate being mounted on the first substrate via a plurality of solder terminals; a plurality of second pads each provided on the first surface of the second substrate to face a corresponding one of the first pads provided on the first surface of the first substrate, and wherein each of the plurality of solder terminals extends between a corresponding first pad and a corresponding second pad and comprises a solder coated thereon; a second protection film formed on the first surface of the second substrate, through which the second pads are exposed; a resin layer provided between the first substrate and the second substrate such that the solder terminals and the semiconductor element are embedded in the resin layer; and a plurality of dams each provided at least partly around at least one of the corresponding first pad and the corresponding second pad so as to project away from at least one of the first and second protection films, the dams being configured to restrain the solder flowing from the solder terminals.

Other aspects and advantages of the present invention will be apparent from the following description, the drawings and the claims.

DETAILED DESCRIPTION OF EXEMPLARY EMBODIMENTS

Figure 1:
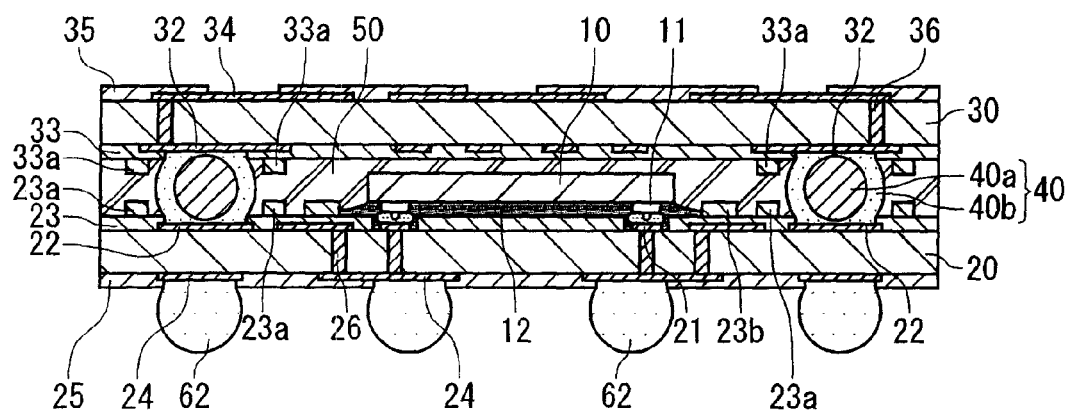
FIG. 1 is a cross-sectional view showing a configuration of a semiconductor element built-in device according to a first embodiment of the present invention.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

(Semiconductor Element Built-in Device)

FIG. 1 is a cross-sectional view showing a configuration of a semiconductor element built-in device according to a first embodiment of the present invention.

Figure 13:
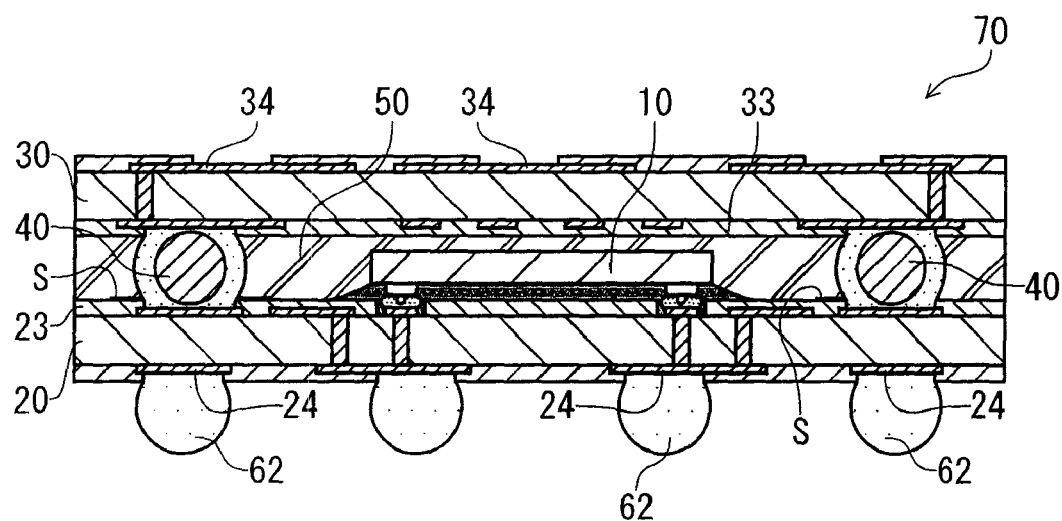
FIG. 13 is a cross-sectional view (#4) showing a step of manufacturing the semiconductor element built-in device in the related art.

A basic configuration of a semiconductor element built-in device in the present embodiment is common to a configuration of the related art semiconductor element built-in device 70 shown in FIG. 13. That is, the semiconductor element 10 is mounted on the first substrate 20, then the second substrate 30 is bonded to the first substrate 20 via the solder terminals 40, then the resin 50 is filled in the space between the first substrate 20 and the second substrate 30 such that the semiconductor element 10 and the solder terminals 40 are sealed with the resin 50, and then the external connection terminal 62 is provided to the connection pads 24 on the outer surface of the first substrate 20 respectively.

The semiconductor element 10 is flip-chip connected to the first substrate 20 by connecting the electrodes 11 to electrodes (element connection pads) 21 of the first substrate 20. The semiconductor element 10 is mounted on the first substrate 20 by filling an underfill resin 12 into an area in which the semiconductor element 10 and the first substrate 20 are opposed to each other.

The wiring patterns including the electrodes 21, to which the semiconductor element 10 is connected, and the pads 22, to which the solder terminal 40 is joined respectively, are formed on the semiconductor element mounting surface of the first substrate 20. The semiconductor element mounting surface of the first substrate 20 except the electrodes 21 and the pads 22 is covered with the protection film 23 made of the solder resist. The wiring patterns including the connection pads 24, to which the external connection terminal 62 is provided respectively, are formed on the opposite surface (mounting surface) of the semiconductor element mounting surface of the first substrate 20. The mounting surface of the first substrate 20 except the connection pads 24 is covered with the protection film 25 made of the solder resist.

Through holes 26 are formed to pass through the first substrate 20 in the thickness direction. The wiring patterns being formed on the semiconductor element mounting surface of the first substrate 20 and the wiring patterns being formed on the mounting surface are electrically connected via the through holes 26.

The wiring patterns including the pads 32 to which the solder terminal 40 is provided respectively are formed on the surface, which opposes to the first substrate 20, of the second substrate 30. The surface of the second substrate 30, to which the resin 50 is adhered, except the pads 32 is covered with the protection film 33 made of the solder resist. Also, the wiring patterns including connection pads 34 are formed on the outer surface (the mounting surface on which the BGA type semiconductor element, or the like is mounted) of the second substrate 30, and also the mounting surface of the second substrate 30 except the connection pads 34 is covered with a protection film 35 made of the solder resist.

Through holes 36 are formed to pass through the second substrate 30 in the thickness direction. The wiring patterns including the pads 32 on the second substrate 30 and the wiring patterns including the connection pads 34 are electrically connected via the through holes 36.

According to the semiconductor element built-in device 100, dams 23a, 33a for blocking the solder from flowing to the pads 22, 32 respectively are provided around the pads 22 on the first substrate 20 and the pads 32 on the second substrate 30, respectively. Each of the dams 23a is provided on the protection film 23 to surround the periphery of the pad 22 like an annular ring. Also, each of the dams 33a is provided on the protection film 33 to surround the periphery of the pad 32 like an annular ring.

Figure 2:
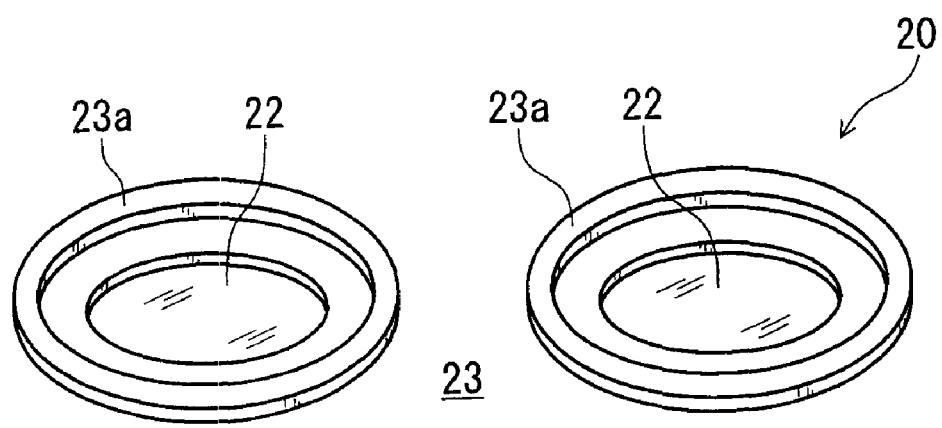
FIG. 2 is a perspective view showing an example of a dam configuration formed around a pad in the first embodiment.

FIG. 2 shows a perspective view of the dam 23a that is formed on the surface of the first substrate 20. The dam 23a is formed to surround the pad 22, which is exposed from the protection film 23, like an annular ring whose diameter is larger than a diameter of the peripheral portion of the pad 22. Also, the dam 23a is formed on the surface of the first substrate 20 by one level higher than the surface of the protection film 23. Like the protection film 23, the dam 23a is formed of the solder resist.

Figure 3A:
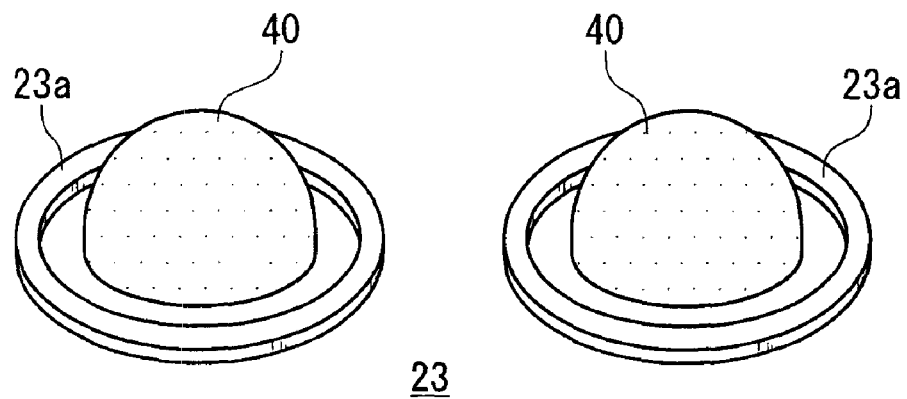
FIGS. 3A and 3B are perspective views showing the function of the dam.
Figure 3B:
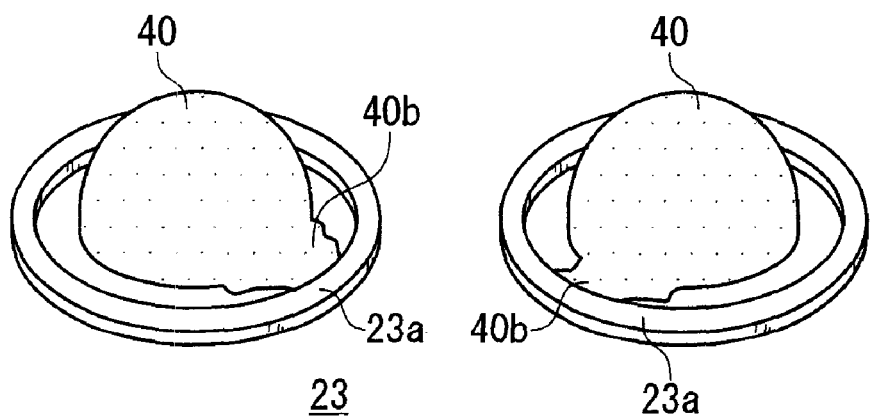

In FIGS. 3A and 3B, a function of the dam 23a that is provided in the first substrate 20 is illustrated. FIG. 3A shows a state that the solder terminal 40 is provided to the pad 22. Actually, the solder terminal 40 is also provided to the pad 32. In FIG. 3, a connection state between the solder terminal 40 and the second substrate 30 is omitted from the illustration.

FIG. 3B shows a state that, when the reflow heating is performed upon providing the external connection terminal 62, the solder 40b of the solder terminal 40 flows out from the connection area between the pad 22 and the solder terminal 40. As described above, the flowing-out of the solder 40b is caused by insufficient adhesion between the resin 50 and the protection film 23, and thus the solder 40b flows into the clearance that is generated at the boundary between the resin 50 and the protection film 23.

In the present embodiment, the dam 23a is provided to surround the pad 22. Therefore, the solder 40b flowing out from the pad 22 is blocked by the dam 23a. As a result, not only it is possible to prevent such a situation that the solder 40b flows out up to the adjacent pad 22, but also it is possible to prevent such a situation that the electrical short-circuit is caused due to the flowing-out of the solder 40b.

As shown in FIG. 1, in the semiconductor element built-in device 100, the dam 23a is provided on the peripheries of respective pads 22 on the first substrate 20. The location of occurrence of the clearance that is generated at the boundary between the resin 50 and the protection film 23 is uncertain. However, the dam 23a is provided around each pad 22, so that it is possible to prevent, without fail, the electrical short-circuit between the pads 22, which is caused by the solder 40b flowing out from the solder terminal 40 in the reflow heating step performed in providing the connection terminals 62 such as the solder balls to the connection pads 24.

Also, because the dam 23a is provided around the pad 22, a contact area between the protection film 23 and the resin 50 is increased as compared with the case where the dam 23a is not provided. Therefore, the dam 23a acts on the resin 50 as an anchor, and the adhesion (sticking) between the protection film 23 and the resin 50 can be improved, and the clearance is hard to occur at the boundary between the protection film 23 and the resin 50. Thus, it is possible to prevent the flowing-out of the solder 40b being heated and fused in the reflow heating step performed in providing the connection terminals 62 to the connection pads 24.

The configuration of the dam 23a provided on the first substrate 20 is illustrated in FIG. 2. Also, the dam 33a provided on the second substrate 30 is formed through the same steps as steps of manufacturing the dam 23a.

Upon sealing the semiconductor element 10 and the solder terminals 40 with the resin 50, the clearance may be generated at the boundary between the protection film 33 on the second substrate 30 and the resin 50. Therefore, there is such a possibility that, in the step of reflow heating performed upon providing the connection terminals 62, the solder 40b flows out from the connection area between the pad 32 and the solder terminal 40. In this case, because the dam 23a is provided around the pad 32 like an annular ring, the solder 40b flowing out from the pad 32 is blocked by the dam 33a. Thus, it is possible to prevent such a situation that the pads 32 are electrically short-circuited by the solder 40b.

Here, in the step of reflow heating performed in providing the external connection terminal 62 to the connection pads 24, the reflow process is performed in a state that the first substrate 20 is provided in the lower side. Thus, it is likely that, in the first substrate 20 located below the second substrate 30, the solder 40b fused from the solder terminal 40 flows onto the adjacent pads 22, 23. Accordingly, in such a situation that the flowing-out of the solder 40b on the second substrate 30 does not occur, the dam 23a might be only provided around the pad 22 on the first substrate 20, while the dam 33a might not be provided on the second substrate 30. When a vertical relationship between the first substrate 20 and the second substrate 30 in the reflow heating is reversed, the above-mentioned situations would be reversed.

The semiconductor element built-in device 100 may be employed in such a way that another semiconductor package on which the semiconductor element e.g., the BGA-type semiconductor device is mounted, is mounted via the connection pads 34 provided on the second substrate 30. Also, another method of mounting the semiconductor element or the circuit component on the element mounting surface of the second substrate 30 may be applied. In this case, instead of the connection pads 34, the pads or the electrodes electrically connected to the semiconductor element or the circuit component may be provided on the element mounting surface of the second substrate 30.

According to the above semiconductor element built-in device 100, the dams 23a, 33a are provided around the pads 22, 23 on the first substrate 20 and the second substrate 30, respectively.

Figure 4A:
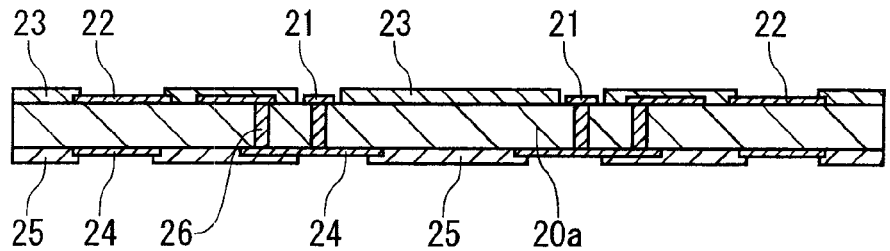
FIGS. 4A to 4C are cross-sectional views showing steps of manufacturing a first substrate in the semiconductor element built-in device.
Figure 4B:
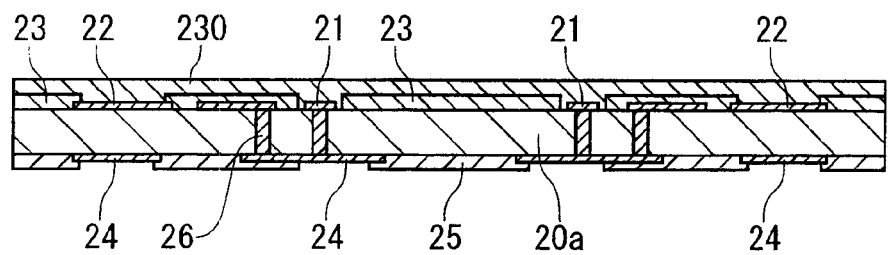
Figure 4C:
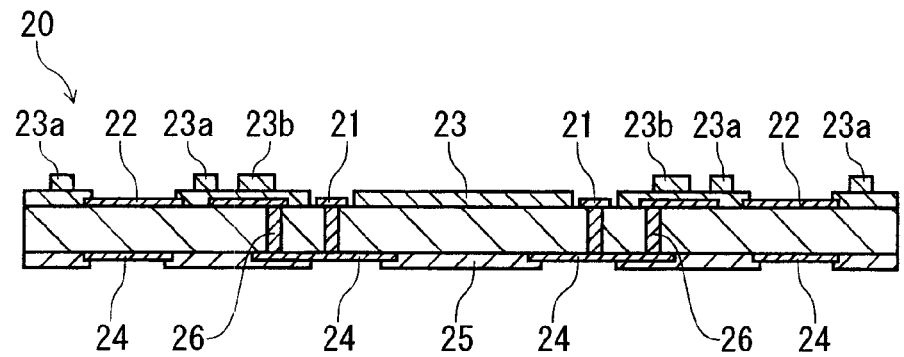

FIGS. 4A to 4C show the steps of forming the dam 23a of the first substrate 20. FIG. 4A shows a state that the protection film 23 made of solder resist is formed on the semiconductor element mounting surface of a substrate 20a to expose the electrodes 21 and the pads 22, and also a protection film 25 made of solder resist is formed on the mounting surface of the substrate 20a to expose the connection pads 24.

The wiring patterns including the electrodes 21 and the pads 22 are formed on the element mounting surface of the substrate 20a, and the wiring patterns including the connection pads 24 are formed on the mounting surface. As the method of forming the wiring patterns on both surfaces of the substrate 20a, the method of patterning the conductor layer formed on both surfaces of the substrate 20a, the method of forming a plating seed layer on both surfaces of the substrate 20a and then applying the electroplating using the plating seed layer as a power feeding layer, and others can be utilized. The through holes 26 that pass through the substrate 20a in the thickness direction can be formed by the through hole plating.

In order to pattern the protection film 23 to expose the electrodes 21 and the pads 22 from the protection film 23, the surface of the substrate 20a may be covered with a photosensitive solder resist, and then the solder resist may be exposed and developed in accordance with planar layout patterns of the electrodes 21 and the pads 22. When the protection film 25 is formed to expose the connection pads 24, the photosensitive solder resist may be exposed and developed in accordance with planar layouts of the connection pads 24.

FIGS. 4B and 4C show the steps of forming the dam 23a. FIG. 4B shows a state that the protection films 23, 25 are formed, and then a photosensitive solder resist 230 is formed on the element mounting surface of the substrate 20a on which the protection film 23 is formed. Then, the dams 23a can be formed through exposure/development of the photosensitive solder resist 230 in accordance with planar patterns (annular patterns) of the dams 23a (see FIG. 4C).

In the present embodiment, in the steps of exposing/developing the solder resist 230, dams 23b may be formed to prevent the flowing-out of the underfill resin caused by flip-chip connecting the semiconductor element 10. The dams 23a configured to prevent the flowing-out of the underfill resin are formed like rectangular frame that surrounds a mounting area of the electrode 21 (the semiconductor element mounting area)

The dams 23a configured to prevent the flowing-out of the solder 40b and the dams 23b configured to prevent the flowing-out of the underfill resin are formed by exposing/developing the photosensitive solder resist 230. Therefore, arrangements, sizes, shapes of the dams 23a, 23b can be set arbitrarily depending on the exposure patterns. Heights of the dams 23a, 23b depend on a thickness of the solder resist 230 respectively. Therefore, the solder resist 230 having a suitable thickness may be used to meet respective heights of the dams 23a, 23b. The solder resist 230 is formed by coating the resist material or laminating a resist film.

As the solder resist 230, the same material as the solder resist used in forming the protection film 23 may be employed. Of course, the different material may be employed.

According to the present embodiment, it is advantageous in that the dams 23a configured to prevent the flowing-out of the solder 40b and the dams 23b configured to prevent the flowing-out of the underfill resin can be formed in the same exposure/development step.

The method of forming the dams 33a on the second substrate 30 is similar to the method of forming the dams 23a on the first substrate 20.

Figure 5A:
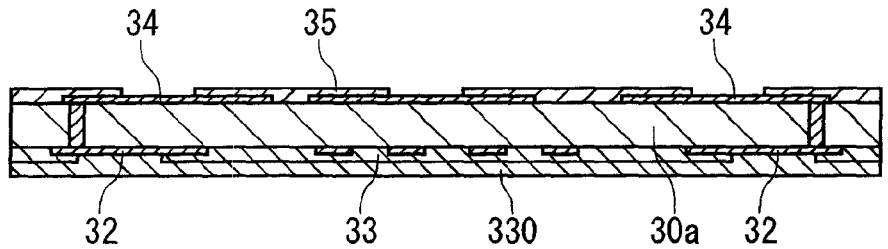
FIGS. 5A to 5C are cross-sectional views showing steps of manufacturing a second substrate in the semiconductor element built-in device.

In FIG. 5A, there is provided a substrate 30a on one surface of which the wiring patterns including the pads 32 are formed to oppose to the first substrate 20 and on the other surface of which the wiring patterns including the connection pad 34 are formed. Then, the protection films 33, 35 are formed on both surfaces of the substrate 30a respectively, and then a photosensitive solder resist 330 serving as the dam 33a is formed on one surface of the substrate 30a.

Figure 5B:
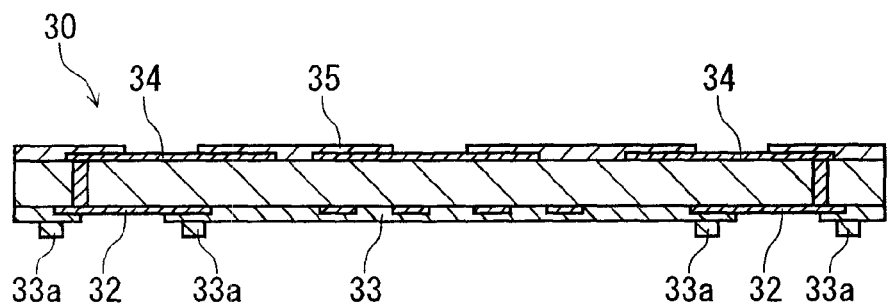

The dams 33a are formed to surround the periphery of the pad 32 formed on one surface of the substrate 30a respectively, by exposing/developing this solder resist 330. Thus, the second substrate 30 is formed (see FIG. 5B).

Figure 5C:
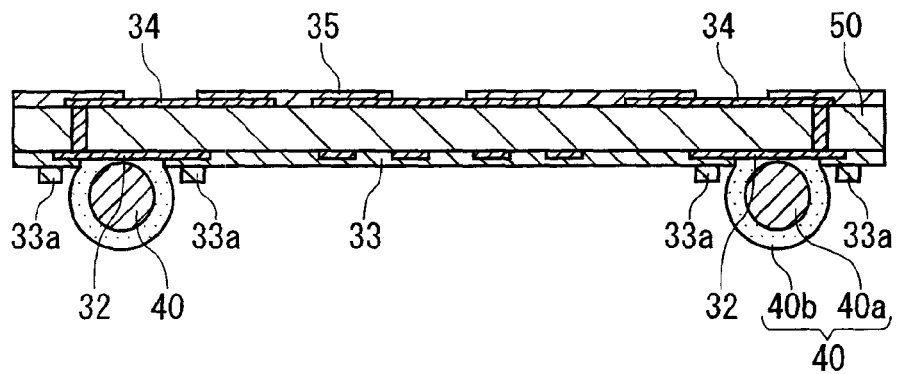

The solder terminals 40 connecting the first substrate 20 and the second substrate 30 are in advance provided to the pads 32 of the second substrate 30 (see FIG. 5C). In the solder terminal 40 according to the present embodiment, the copper ball 40a is employed as the core and an outer surface of the copper ball 40a is covered with the solder 40b. Because the copper ball 40a is used as the core, a separation interval between the first substrate 20 and the second substrate 30 can be ensured at a predetermined interval. Of course, the solder balls not including the core such as the copper ball can be employed as the solder terminals.

Figure 6A:
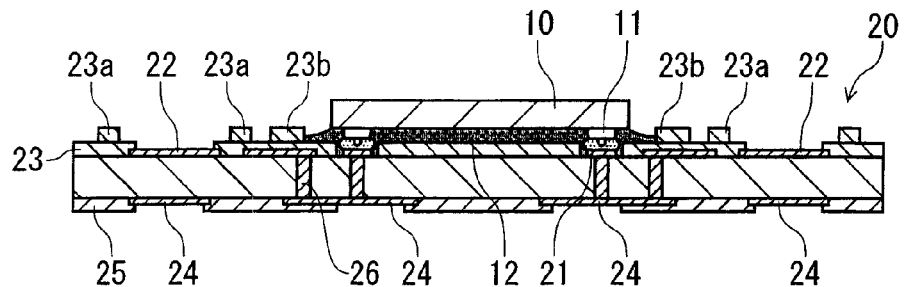
FIGS. 6A to 6C are cross-sectional views showing steps of assembling the first substrate and the second substrate.

FIG. 6A shows a state that the semiconductor element 10 is mounted on the first substrate 20. The semiconductor element 10 is mounted on the first substrate 20 by aligning and connecting the electrodes 11 and the electrodes 21 mutually, then filling the underfill resin 12 into a space between the semiconductor element 10 and the first substrate 20, and then thermally curing the underfill resin 12. With the dams 23b, it is possible to prevent such a situation that the underfill resin 12 flows out up to the upper surface of the pad 22. In this case, the semiconductor element 10 may be flip-chip connected after the underfill resin 12 is provided to the element mounting area of the first substrate 20.

As the step before or after the semiconductor element 10 is mounted on the first substrate 20, the surfaces of the protection film 23 and the dam 23b are made rough by applying the plasma process to the element mounting surface of the first substrate 20. The adhesion between the underfill resin 12 and the protection film (solder resist) 23 can be improved by the plasma process applied before the semiconductor element 10 is mounted on the first substrate 20. Also, the adhesion between the resin 50 and the protection film 23 can be improved by the plasma process after the semiconductor element 10 is mounted on the first substrate 20.

Because the surfaces of the protection film 23 and the dams 23a are made rough by the plasma process, the adhesion (sticking) between the resin 50 and the protection film 23 and the dams 23a can be improved. Therefore, such an event can be suppressed that the clearance is generated at the boundaries between the resin 50 and the protection film 23 and the dams 23a.

Figure 6B:
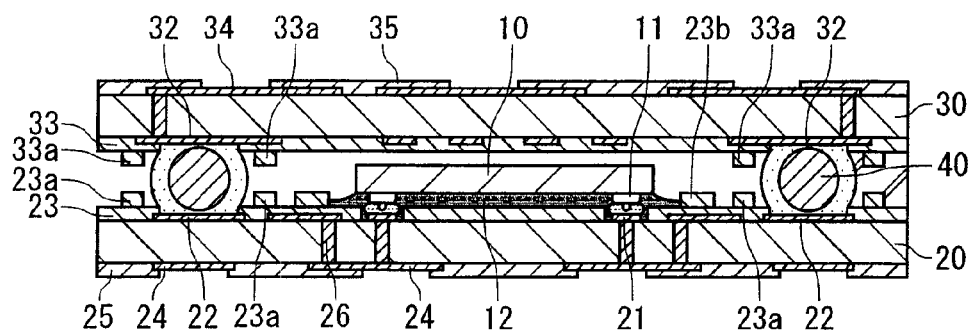

FIG. 6B shows a state that the first substrate 20 and the second substrate 30 are bonded together via the solder terminals 40. The pads 22, 32 of the first substrate 20 and the second substrate 30 are aligned mutually, and the first substrate 20 and the second substrate 30 are bonded to each other by fusing the solder 40b while keeping a separation interval between them. Thus, the first substrate 20 and the second substrate 30 can be bonded together.

Figure 6C:
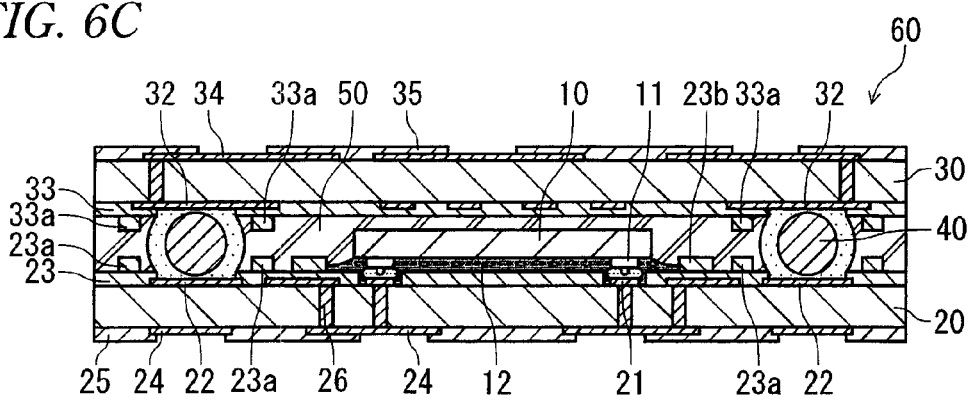

FIG. 6C shows the stacked substrate 60 in which the first substrate 20 and the second substrate 30 are integrated together by filling the resin 50 in a space formed between the first substrate 20 and the second substrate 30. The first substrate 20 and the second substrate 30 are clamped by the resin sealing mold. Then, the fused resin 50 is filled into the space between the first substrate 20 and the second substrate 30 and is thermally cured, so that the semiconductor element 10 and the solder terminals 40 are sealed with the resin 50. Thus, it is possible to obtain the stacked substrate 60 in which the first substrate 20 and the second substrate 30 are integrated together.

The contact areas between the resin 50 and the first substrate 20 and the second substrate 30 can be increased by the dams 23a, 23b, 33a. Also, the first substrate 20 and the second substrate 30 are integrated together more firmly by an anchor action of the dams 23a, 23b, 33a.

After the stacked substrate 60 is formed by coupling integrally the first substrate 20 and the second substrate 30, the solder ball is arranged on the connection pads 24 respectively, and then the external connection terminal 62 is bonded to the connection pads 24 by the reflow heating. Thus, the semiconductor element built-in device 100 can be obtained. FIG. 1 shows a state that the external connection terminal 62 is bonded to the connection pads 24 in FIG. 6C, respectively.

Even when the solder 40b of the solder terminal 40 sealed in the resin 50 is fused during the reflow heating and then the fused solder 40b flows into the clearance at the boundary between the resin 50 and the protection films 23, 33, the flowing-out of the solder 40b is blocked by the dams 23a, 33a. Therefore, it is possible to prevent such a situation that the pads are electrically short-circuited, and also occurrence of the failure caused due to the electrical short-circuit can be suppressed. As a result, the semiconductor element built-in device 100 can be manufactured without fail.

In the above embodiment, the semiconductor element built-in device 100 is completed by providing the connection terminals 62 to the stacked substrate 60. In this case, the stacked substrate 60 to which the connection terminals 62 are not provided can also be treated as the semiconductor element built-in device. Also, in the semiconductor element built-in device, the semiconductor element or the circuit component may be mounted on the second substrate 30. In such case, the electrodes or the pads, which are connected to the semiconductor element or the circuit component, are formed on the element mounting surface of the second substrate 30 of the stacked substrate 60, then the semiconductor element or the circuit component is mounted on the stacked substrate 60, and then the connection terminals 62 are provided to the connection pads 24 of the first substrate 20 by reflow heating. In the reflow heating, as described above, the dams 23a, 33a serves to prevent the electrical short-circuit.

FIGS. 7A to 7D show another example of the dam 23a formed on the first substrate 20.

Figure 7A:
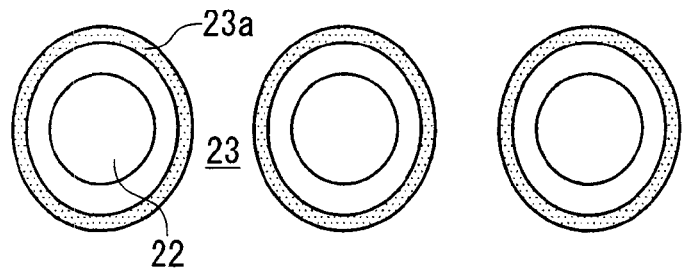
FIGS. 7A to 7D are plan views showing another example of the dam configuration in the first embodiment.

FIG. 7A is a view showing the dam 23a that is formed like an elliptic ring when viewed from a top. When a layout interval of the pads 22 is narrow in one direction but is wide in a direction orthogonal to said one direction, the dam 23a is shaped into an ellipse whose major axis is set in the direction along which an arranged interval of the pads 22 is set wide, to secure the solder flow-in area as wider as possible. Therefore, it is possible to effectively prevent the electrical short-circuit caused due to the flowing-out of solder to the outside of the dam 23a.

When the dam 23a is formed to surround the periphery of the pad 22, the shape of the dam 23a is not limited to a circular shape or an elliptic shape, and a polygonal shape such as a rectangle. Any surrounding shape may be employed. The shape or the arrangement of the dams 23a, 33a may be set arbitrarily by designing adequately the exposure pattern that is used to expose the photosensitive solder resist.

Figure 7B:
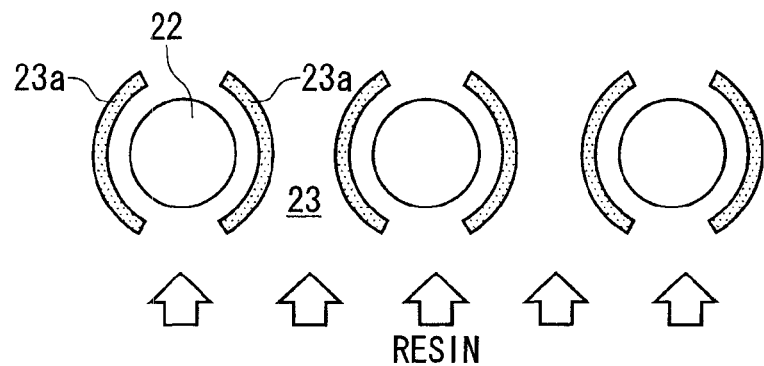
Figure 7C:
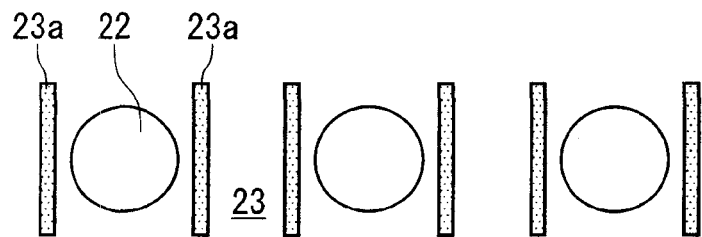
Figure 7D:
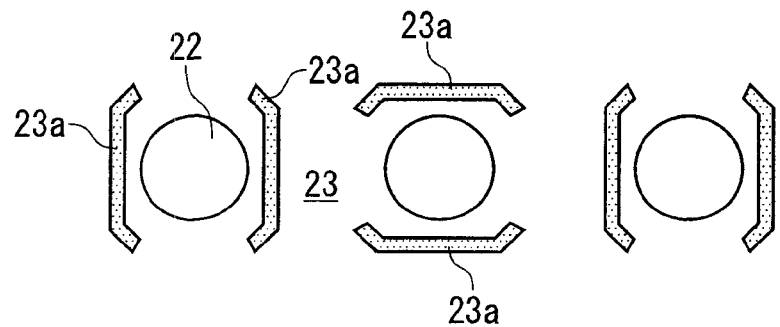

FIGS. 7B to 7D are views showing the dams 23a that are not formed to continuously surround the periphery of the pad 22, but at least a part of enclosure around the periphery of the pad 22 in the peripheral direction is cut off.

FIG. 7B is a view showing circular arc dams 23a that are formed by dividing the annular dam 23a into two pieces. FIG. 7C is a view showing linear dams 23a that are arranged at a predetermined distance. FIG. 7D is a view showing dams 23a that are formed by bending both end portions of the straight portion. In the examples, a pair of dams 23a is oriented in the symmetric positions with the pad 22 interposed therebetween.

FIGS. 7B and 7C are views showing the dams 23a that are parallel to each other i.e., the opening portions of the dams 23a are directed to the same direction respectively. FIG. 7D is a view showing the dams 23a that are arranged such that the adjacent dams 23a, i.e., the opening portions of the dams 23a, are orthogonal to each other (about 90 degree).

When the resin 50 is filled into a space between the first substrate 20 and the second substrate 30 after the first substrate 20 and the second substrate 30 are bonded together, the resin 50 is injected from one end side of the substrates. Accordingly, as shown in FIGS. 7B and 7C, when the opening portion of the dam 23a is directed toward the flowing direction of the resin 50 (the direction indicated with an arrow in FIG. 7B), it is more unlikely that the flow of the resin 50 is blocked as compared with the case where the dam 23a is formed to surround the periphery of the pad 22. Thus, the resin 50 can be filled without fail. As a result, the occurrence of the clearance at the boundary between the resin 50 and the protection film 23 can be suppressed, and the electrical short-circuit caused by the event that the solder flows out into the clearance can be suppressed.

In this manner, when the opening portion is provided in the dam 23a, it is advantageous in that the shape of the dam 23a should be set in light of the injecting direction (flowing direction) of the resin 50.

FIG. 7D is a view showing a situation that the flowing direction of the resin 50 and the orientation of the dam 23 are not particularly related with each other. Actually, an interval between the first substrate 20 and the second substrate 30 is set to be considerably narrow. When the dams 23a, 33a are formed on the first substrate 20 and the second substrate 30, a clearance for allowing the resin 50 to pass therethrough is further narrowed in the areas where the dams 23a, 33a are formed. As a result, as the method or making it easy to fill the resin 50 into a space between the first substrate 20 and the second substrate 30 regardless of the flowing direction of the resin 50, it is advantageous in that the passage through which the resin 50 passes should be widened by providing the opening portion in the dam 23a. The resin 50 is filled from the flow path through which the resin 50 can pass more easily.

Also, in FIGS. 7B and 7C, the adjacent pads 22 are separated by the dam 23a. In this case, when the pad 22 is arranged on the opened side of the dam 23a, the dam 23a might not be configured to sufficiently suppress the electrical short-circuit between the pads 22 that are arranged on the opening side of the dam 23a. In contrast, as shown in FIG. 7D, when the direction of the dam 23a is changed every pad 22 by 90 degree, such an advantage can be obtained that respective separated locations of the dams 23a are oriented isotropically and the dams 23a is able to suppress the electrical short-circuit in every direction.

In FIGS. 7B to 7D, the two opening portion are provided in the dam, but the number of opening portions might be one or three or more. Also, the shape of the dam can be set arbitrarily.

Also, FIGS. 7A to 7D show the dams 23a provided on the first substrate 20, but the totally similar shape can be applied to the dams 33a provided on the second substrate 30.

FIGS. 8A to 9C are views to explain a relationship of alignment positions between the first substrate 20 and the second substrate 30, respectively.

Figure 8A:
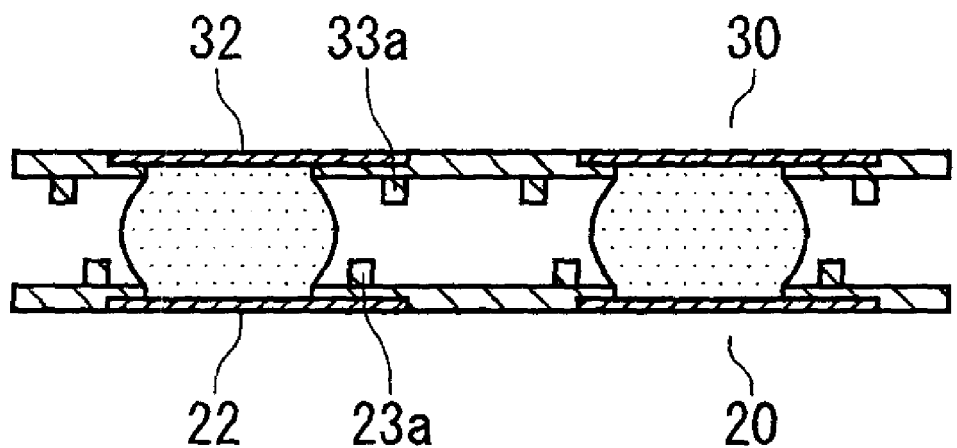
FIG. 8A is a cross-sectional view showing another example of the dam configuration in the first embodiment.
Figure 8B:
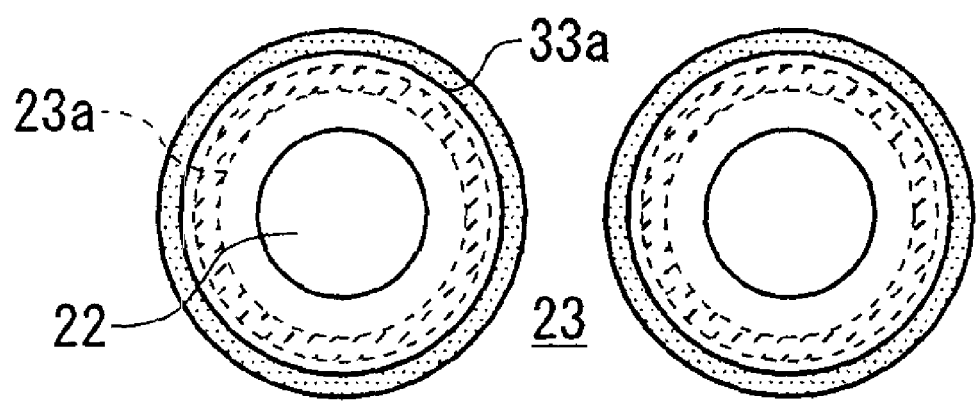
FIG. 8B is a plan view showing the dam configuration shown in FIG. 8A.

FIGS. 8A and 8B are views showing a state that the diameter of the dam 23a provided on the first substrate 20 is set smaller than that of the dam 33a provided on the second substrate 30. In this configuration, when viewed from the top, the dams 23a, 33a that are provided around the pads 22, 23 are not overlapped with each other (no overlapping layout). Because the pads 22, 23 of the first substrate 20 and the second substrate 30 are located in the same planar positions, the dam 23a and the dam 33a are located in the concentric planar layout, as shown in FIG. 8B.

In this manner, the dams 23a, 33a provided around the opposing pads 22, 23 between the first substrate 20 and the second substrate 30 are arranged in the non-overlapping position. Therefore, when the resin 50 is filled in the clearance between the first substrate 20 and the second substrate 30, filling ability and wettability of the resin 50 located in vicinity of the pads 22, 32 can be improved, and the operation for filling the resin 50 into the space between the first substrate 20 and the second substrate 30 can be carried out without fail.

This is similarly true of the case where the dam 23a on the first substrate 20 is set larger in diameter than the dam 33a on the second substrate 30. In this case, the shapes of the dams 23a, 33a are not limited to the annular ring shape. The filling ability of the resin 50 can be improved by arranging the dams 23a, 33a such that the dam 23a on the first substrate 20 and the dam 33a on the second substrate 30 are not overlapped mutually in the planar layout, i.e., such that the non-overlapped area is produced at least partially in the planar layout.

Figure 9A:
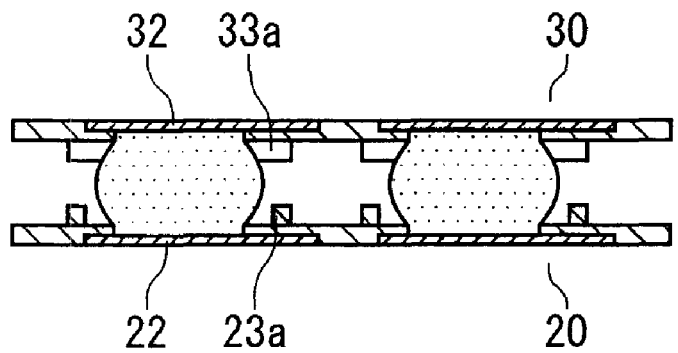
FIG. 9A is a cross-sectional view showing still another example of the dam configuration in the first embodiment.
Figure 9B:
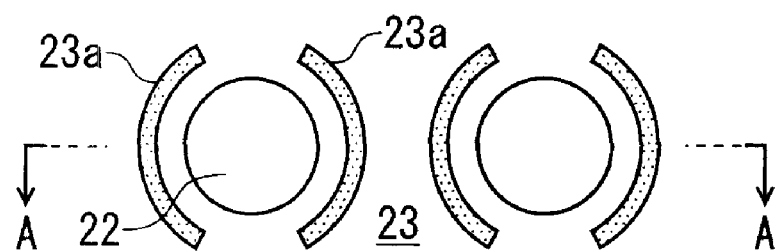
FIGS. 9B and 9C are plan views showing the dam configuration shown in FIG. 9A.
Figure 9C:
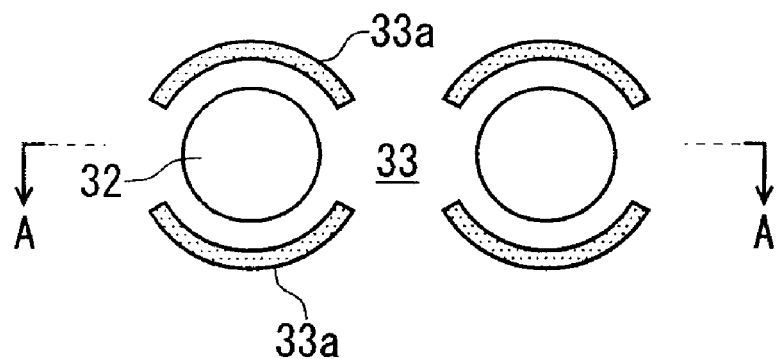
Figure 10:
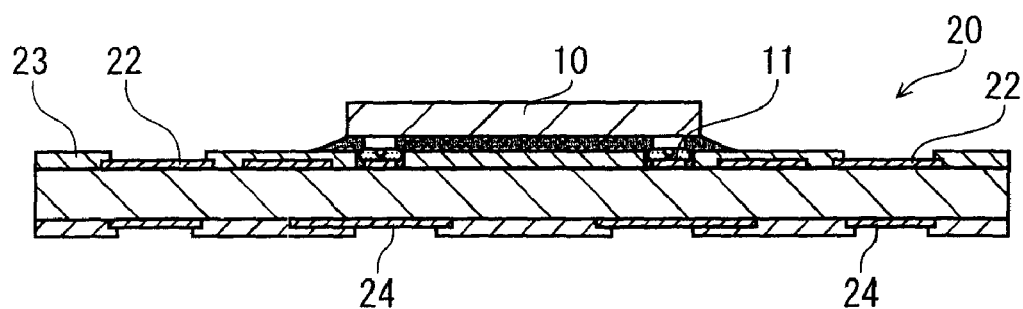
FIG. 10 is a cross-sectional view (#1) showing a step of manufacturing a semiconductor element built-in device in the related art.
Figure 11:
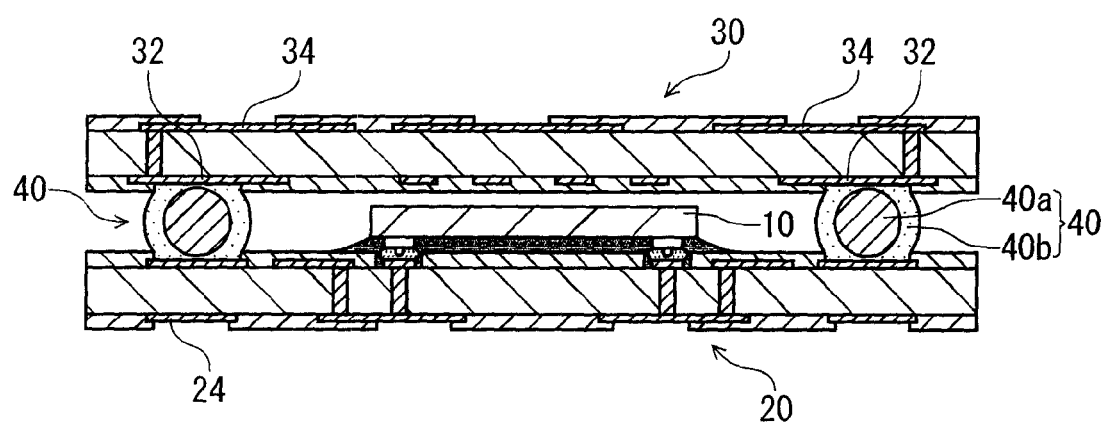
FIG. 11 is a cross-sectional view (#2) showing a step of manufacturing the semiconductor element built-in device in the related art.
Figure 12:
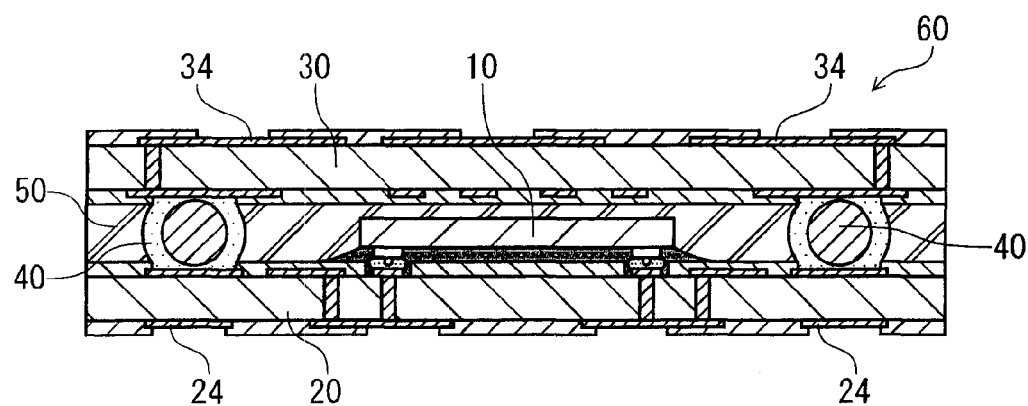
FIG. 12 is a cross-sectional view (#3) showing a step of manufacturing the semiconductor element built-in device in the related art.

FIGS. 9A to 9C are views showing an example in which the directions (opened directions) of the opening portions are orthogonal to each other on the first substrate 20 and the second substrate 30. Also, the opening positions of the dams 23a, 33a are arranged not to overlap with each other in the planar layout. FIG. 9B is a view showing the planar layout of the dam 23a on the first substrate 20, and FIG. 9C is a view showing the planar layout of the dam 33a on the second substrate 30. FIG. 9A is a cross-sectional view taken along an A-A line in FIGS. 9B and 9C.

When the cut-off positions of the dam 23a and the dam 33a are arranged not to overlap with each other in the planar layout, a clearance between the dams 23a, 33a on the first substrate 20 and the second substrate 30 is expanded substantially in contrast to the case where the dams 23a, 33a are arranged to oppose completely to each other, and therefore flowability of the resin 50 can be improved.

In the example shown in FIGS. 9A to 9C, the planar shape of the dams 23a, 33a is not limited to the circular arc shape, and any shape may be employed appropriately. Also, the opening positions and the opened directions provided to the dams 23a, 33a are not limited to the illustrated example respectively.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A semiconductor element built-in device, comprising:
a first substrate comprising a first surface and a second surface, which are formed on opposite sides of the first substrate;
a first pad provided on the first surface of the first substrate;
a first protection film formed on the first surface of the first substrate, through which the first pad is exposed;
a semiconductor element provided on the first surface of the first substrate such that the semiconductor element is surrounded by the first pad;
a second substrate comprising a first surface and a second surface, which are formed on opposite sides of the second substrate, the second substrate being mounted on the first substrate via a solder terminal;
a second pad provided on the first surface of the second substrate to face the first pad provided on the first surface of the first substrate, wherein the solder terminal extends between the first pad and the second pad and comprises solder coated thereon;
a second protection film formed on the first surface of the second substrate through which the second pad is exposed;
a resin layer provided between the first substrate and the second substrate such that the solder terminal and the semiconductor element are embedded in the resin layer; and
a dam provided at least partially around at least one of the first and second pads so as to project away from at least one of the first and second protection films, the dam being configured to restrain the solder flowing from the solder terminal.

2. The device of claim 1, wherein the dam is provided to completely surround the at least one of the first and second pads.

3. The device of claim 1, wherein the dam is provided discontinuously around the at least one of the first and second pads.

4. The device according to claim 1, wherein the dam comprises:
a first dam provided to surround the first pad and to project away from the first protection film; and
a second dam provided to surround the second pad and to project away from the second protection film, and
wherein the first dam and the second dam are not completely overlapped with each other.

5. A semiconductor element built-in device, comprising:
a first substrate comprising a first surface and a second surface, which are formed on opposite sides of the first substrate;
a plurality of first pads each provided on the first surface of the first substrate;
a first protection film formed on the first surface of the first substrate, through which the first pads are exposed;
a semiconductor element on the first surface of the first substrate;
a second substrate comprising a first surface and a second surface, which are formed on opposite sides of the second substrate, the second substrate being mounted on the first substrate via a plurality of solder terminals;
a plurality of second pads each provided on the first surface of the second substrate to face a corresponding one of the first pads provided on the first surface of the first substrate, and wherein each of the plurality of solder terminals extends between a corresponding first pad and a corresponding second pad and comprises a solder coated thereon;
a second protection film formed on the first surface of the second substrate, through which the second pads are exposed;
a resin layer provided between the first substrate and the second substrate such that the solder terminals and the semiconductor element are embedded in the resin layer; and
a plurality of dams each provided at least partially around at least one of the corresponding first pad and the corresponding second pad so as to project away from at least one of the first and second protection films, the dams being configured to restrain the solder flowing from the solder terminals.

6. The device of claim 5,
wherein each of the dams is provided discontinuously around the at least one of the corresponding first pad and the corresponding second pad, and is divided into a first dam portion and a second dam portion,
wherein the first dam portion and the second dam portion are symmetrical to each other, and
wherein the first and second dam portions of the dams are parallel with each other.

7. The device of claim 5, wherein
each of the dams is provided discontinuously around the at least one of the corresponding first pad and the corresponding second pad, and is divided into a first dam portion and a second dam portion,
wherein the first dam portion and the second dam portion are symmetrical to each other, wherein the first and second dam portions of the adjacent dams are orthogonal to each other.

8. The device of claim 5, wherein the plurality of dams comprise:
a plurality of first dams each provided to completely surround the corresponding first pad and to project away from the first protection film; and
a plurality of second dams each provided to completely surround the corresponding second pad and to project away from the second protection film,
wherein the first dam and the second dam are not completely overlapped with each other.

* * * * *